United States Patent
Hirukawa (10) Patent No.: US 6,670,643 B2
(45) Date of Patent: Dec. 30, 2003

(54) SEMICONDUCTOR LASER DEVICE AND ITS MANUFACTURING METHOD, AND OPTICAL DISC REPRODUCING AND RECORDING APPARATUS

(75) Inventor: Shuichi Hirukawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/320,497

(22) Filed: Dec. 17, 2002

(65) Prior Publication Data

US 2003/0122134 A1 Jul. 3, 2003

(30) Foreign Application Priority Data

Dec. 18, 2001 (JP) ......................................... 2001-384511

(51) Int. Cl.[7] .............................................. H01L 27/15
(52) U.S. Cl. ........................... 257/79; 257/103; 257/96; 372/45
(58) Field of Search ................................ 257/79, 94, 96, 257/97, 103, 14, 615, 201; 372/45

(56) References Cited

U.S. PATENT DOCUMENTS 5,762,705 A    6/1998   Fukagai et al.

2003/0122134 A1 *  7/2003  Hirukawa ................. 257/79

FOREIGN PATENT DOCUMENTS

| JP | 2674474 | 9/1997 |
|----|---------|--------|
| JP | 2000-22208 | 1/2001 |

* cited by examiner

Primary Examiner—Mark V. Prenty
(74) Attorney, Agent, or Firm—Morrison & Foerster LLP (57) ABSTRACT

Immediately after stacking of a barrier layer formed of GaAsP of a multiple-strain quantum well active layer 105 at a growth temperature of 650° C., a second upper guide layer 126 formed of AlGaAs is stacked. This second upper guide layer 126 is grown while the temperature is kept at 650° C., which is a growth temperature suitable for P-based layers. By reducing the desorption of P from the barrier layer, the roughness level of the interface between the barrier layer and the second upper guide layer 126 is lowered to 20 Å or less. Thereafter, a first upper guide layer 106 is stacked. Growth temperature of this first upper guide layer 106, which is 650° C. at a start of the growth, is started to be increased concurrently with the growth, and gradually elevated until an end of the growth so as to reach 750° C. at the end of the growth.

11 Claims, 11 Drawing Sheets

SEMICONDUCTOR LASER DEVICE AND ITS MANUFACTURING METHOD, AND OPTICAL DISC REPRODUCING AND RECORDING APPARATUS

BACKGROUND OF THE INVENTION

The present invention relates to semiconductor laser devices and, in particular, to a semiconductor laser device capable of realizing high power, high reliability and long life, as well as its manufacturing method, and further to an optical disc reproducing and recording apparatus.

In recent years, there have been being achieved developments in AlGaAs-based semiconductor laser devices aimed at higher power and longer life by implementing an Al-free (Al-absent) quantum well structure (well layer and barrier layer). This is because the presence of Al at an oscillator end face would cause a surface level to occur at the oscillator end face, making catastrophic optical damage (COD) to be liable to occur, which is disadvantageous for high power, long life and high reliability.

Figure 11:
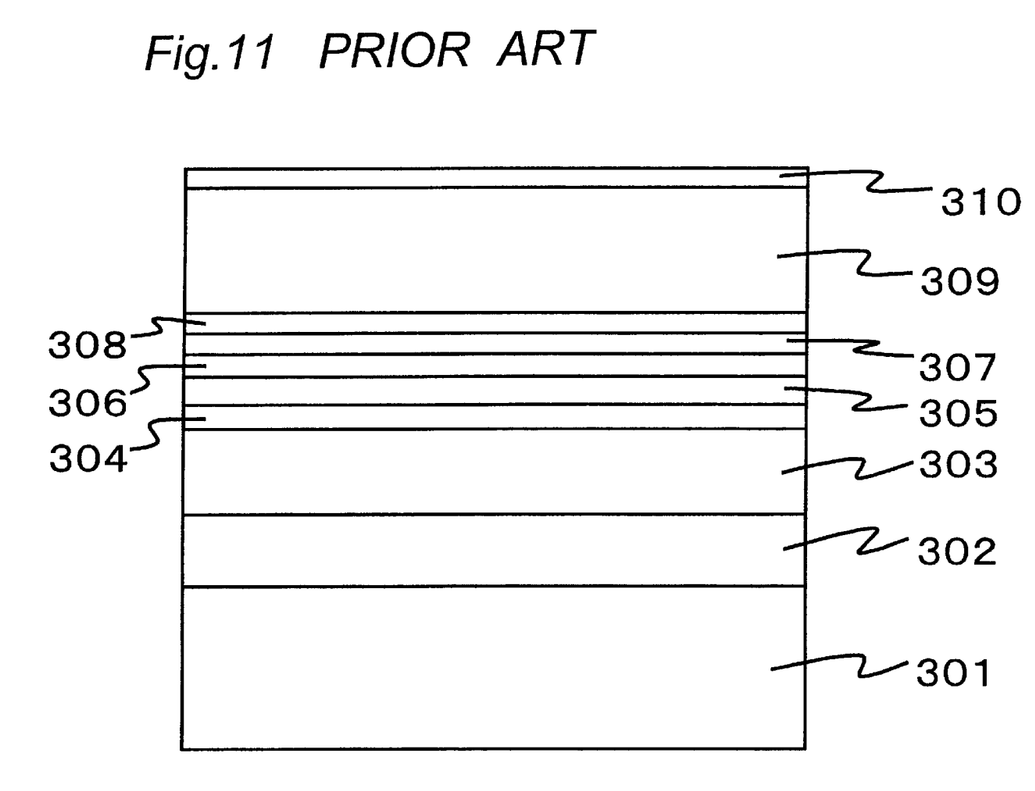
FIG. 11 is a sectional view of a semiconductor laser device according to the prior art.

For example, Japan Journal of Applied Physics Vol. 38 (1999) pp. L387–L389 reports a semiconductor laser device having an Al-free active region. This semiconductor laser device, as shown in FIG. 11, is made up by stacking on a GaAs substrate 301, one after another, a GaAs buffer layer 302, an $Al_{0.63}Ga_{0.37}As$ lower cladding layer 303, an $In_{0.49}Ga_{0.51}P$ lower guide layer 304, an $In_{0.4}Ga_{0.6}P$ barrier layer 305, an $In_{0.13}Ga_{0.87}As_{0.75}P_{0.25}$ well layer 306, an $In_{0.4}Ga_{0.6}P$ barrier layer 307, an $In_{0.49}Ga_{0.51}P$ upper guide layer 308, an $Al_{0.63}Ga_{0.37}As$ upper cladding layer 309 and a cap layer 310.

Generally, there is a difference in optimum growth temperature between an Al-free semiconductor layer and an AlGaAs-based layer. For example, InGaAsP or GaAsP or the like is low in growth temperature, as compared with AlGaAs-based materials. Therefore, in the case where an AlGaAs-based layer is stacked after the stacking of an Al-free semiconductor layer, it is necessary to interrupt the crystal growth after the stacking of the Al-free semiconductor layer, and then elevate the temperature before making the AlGaAs-based layer grown.

Unfortunately, since the Al-free semiconductor layer would remain exposed as a topmost surface during the interruption of crystal growth, temperature elevation would cause P to be desorbed (reevaporated), so that the Al-free semiconductor layer-AlGaAs-based layer interface would become larger in roughness.

To prevent this problem, the above-mentioned conventional semiconductor laser device is so designed that the Al-free semiconductor layer and the AlGaAs-based layer are grown continuously at a constant temperature. This provides an advantage that the crystal growth is not interrupted, thus preventing the Al-free layer from being exposed at the topmost surface during an interruption.

However, in the semiconductor laser device of the prior art as described above, the growth temperature for the continuous crystal growth of the AlGaAs-based layer is 720° C., which is a higher temperature for the Al-free semiconductor layer. It is said that the optimum growth temperature for InGaAsP is about 650° C., for example. As a result, even with the continuous growth, there has been left a problem that P is likely to be desorbed at the growth temperature of 720° C., resulting in a roughened surface. This problem has had causal connections with increased deterioration and worsened reliability of the semiconductor laser device.

SUMMARY OF THE INVENTION

Accordingly, an object of the present invention is to provide a semiconductor laser device, as well as its manufacturing method, in which, for example, a non-P-based semiconductor layer containing no P as a principal ingredient is stacked on a quantum well active layer which is an Al-free P-based semiconductor layer stacked on a GaAs substrate and containing P, the semiconductor laser device having high power, high reliability and long life achieved by improving the crystallinity of the interface between the P-based semiconductor layer and the non-P-based semiconductor layer, and further to provide an optical disc reproducing and recording apparatus using the semiconductor laser device.

In order to achieve the above object, according to the present invention, there is provided a semiconductor laser device including, on a GaAs substrate, at least a first-conductive-type lower cladding layer, a lower guide layer, a quantum well active layer composed of at least one well layer and at least two barrier layers, an upper guide layer and a second-conductive-type upper cladding layer, one on another, wherein at least one layer out of the plurality of layers is a P-based layer formed of group III–V compound semiconductor containing P as a group V element, and a layer adjoining this P-based layer is an As-based layer formed of group III–V compound semiconductor containing not P but As as a group V element, and roughness of an interface between the P-based layer and the As-based layer is not more than 20 Å.

Herein, the first conductive type refers to n type or p type, where if the first conductive type is n type, the second conductive type is p type; and if the first conductive type is p type, the second conductive type is n type.

With this arrangement, the roughness of the interface between the P-based layer and the As-based layer (non-P-based layer) is 20 Å or less. Therefore, the crystallinity of the interface is improved, so that a semiconductor laser device of high reliability, long life and high power can be obtained.

In one embodiment, the interface between the P-based layer and the As-based layer is disposed between the upper cladding layer and the lower cladding layer.

In this embodiment, the interface with its crystallinity improved is in a region where light is confined. Thus, a semiconductor laser device of high reliability, long life and high power can be obtained.

Also, in one embodiment, the P-based layer is formed of InGaAsP, InGaP, GaAsP or AlGaInP.

Also, in one embodiment, the As-based layer is formed of GaAs, AlGaAs, AlAs, InGaAs or AlGaInAs.

Also, in one embodiment, the well layer is the P-based layer.

In this embodiment, since the well layer is the P-based layer, the roughness of the interface of the well layer is 20 Å or less, the crystallinity of the interface concerning the quantum well active layer, i.e., within an active region is improved. Accordingly, a semiconductor laser device of high reliability, long life and high power can be obtained.

Also, the barrier layer is the P-based layer.

In this embodiment, since the barrier layer is the P-based layer, the roughness of the interface of the barrier layer is 20 Å or less, the crystallinity of the interface concerning the quantum well active layer, i.e., within an active region is improved. Accordingly, a semiconductor laser device of high reliability, long life and high power can be obtained.

Also, in one embodiment, both the well layer and the barrier layers are P-based layers and both the upper guide layer and the lower guide layer are As-based layers.

In this embodiment, the crystallinity of the interface between the quantum well active layer, i.e., an active region and the upper and lower guide layers is improved. Accordingly, a semiconductor laser device of high reliability, long life and high power can be obtained.

Also, in one embodiment, both the well layer and the barrier layers are formed of InGaAsP and both the upper guide layer and the lower guide layer in adjacency to the barrier layers are formed of AlGaAs.

In this embodiment, since both the well layer and the barrier layer are formed of InGaAsP, the crystallinity of the interface concerning the quantum well active layer, i.e., within an active region is improved. Further, since both the upper guide layer and the lower guide layer are formed of AlGaAs and the barrier layer is formed of InGaAsP, carrier overflow can be sufficiently suppressed by the energy (Ec) of conduction band and the energy (Ev) of valence band of AlGaAs while the reliability is ensured by preventing AlGaAs of the upper and lower guide layers from adjoining the well layer that involves occurrence of light-emission recombination, by virtue of the fact that the barrier layer formed of InGaAsP can be interposed between the upper and lower guide layers both formed of AlGaAs and the well layer. Accordingly, a semiconductor laser device of high reliability, long life and high power can be obtained.

Also, in one embodiment, Al composition ratio in the group III of the upper guide layer and the lower guide layer is not less than 0.20.

In this embodiment, since Al composition ratio in the group III of the upper guide layer and the lower guide layer is not less than 0.20, there can be obtained with a good balance a conduction-band energy difference (ΔEc) and a valence-band energy difference (ΔEv) with respect to the well layer of the quantum well active layer, so that the carrier overflow can be sufficiently suppressed. Accordingly, a semiconductor laser device of higher reliability, longer life and higher power can be obtained.

Also, in the semiconductor laser device of one embodiment, emission wavelength is not less than 760 nm and not more than 800 nm.

According to the present invention, there is provided a method for manufacturing a semiconductor laser device including, on a GaAs substrate, at least a first-conductive-type lower cladding layer, a lower guide layer, a quantum well active layer composed of at least one well layer and at least two barrier layers, an upper guide layer and a second-conductive-type upper cladding layer, one on another, wherein at least one layer out of the plurality of layers is a P-based layer formed of group III–V compound semiconductor containing P as a group V element, the method comprising the steps of:
subjecting the P-based layer to crystal growth at a first growth temperature; and
above the P-based layer, starting growth of an As-based layer formed of group III–V compound semiconductor containing not P but As as a group V element at a growth temperature approximately equal to the first growth temperature, and thereafter furthering the growth while elevating the temperature to a second growth temperature.

In this method for manufacturing the semiconductor laser device according to the invention, above the P-based layer, i.e., just above the P-based layer or with a layer interposed on the P-based layer, the As-based layer is started to be grown at a growth temperature generally equal to the first growth temperature, which is a growth temperature of the P-based layer. Thereafter, the growth is furthered while the temperature is being elevated to the second growth temperature. Therefore, the roughness level of the interface between the P-based layer and the As-based layer can be lowered to 20 Å or less by reducing the desorption of P from the P-based layer. Thus, according to the present invention, it becomes implementable to fabricate a high-reliability, long-life, high-power semiconductor laser device.

Also, the method for manufacturing a semiconductor laser device of one embodiment further comprises the step of: before the growth of the As-based layer, making one layer or a plurality of layers of other As-based layer grown just above the P-based layer at a temperature approximately equal to the first growth temperature.

In this embodiment, one layer or a plurality of layers of other As-based layer are grown just above the P-based layer at a temperature generally equal to the first growth temperature, which is a growth temperature of the P-based layer. Therefore, the roughness level of the interface of the P-based layer can be lowered to 20 Å or less by reducing the desorption of P more preferably from the P-based layer. Thus, a semiconductor laser device of high reliability, long life and high power can be fabricated.

Also, in one embodiment, the first growth temperature is not less than 600° C. and not more than 680° C.

In this embodiment, since the P-based layer is grown at the first growth temperature of not less than 600° C. and not more than 680° C., which is more suitable for growth, the crystallinity becomes better so that the interface with the As-based layer is improved. Accordingly, a semiconductor laser device of high reliability, long life and high power can be fabricated.

Also, in one embodiment, the second growth temperature is not less than 700° C. and not more than 780° C.

In this embodiment, since the As-based layer is grown at the second growth temperature of not less than 700° C. and not more than 780° C., which is more suitable for growth, the crystallinity becomes better so that the interface with the P-based layer is improved. Accordingly, a semiconductor laser device of high reliability, long life and high power can be fabricated.

According to the present invention, there is provided an optical disc reproducing and recording apparatus which uses the semiconductor laser device as described above.

By virtue of using the semiconductor laser device having higher optical output than conventional, the optical disc reproducing and recording apparatus is enabled to read and write data even if the optical-disc rotating speed is enhanced over the conventional. Thus, the optical disc reproducing and recording apparatus of the invention is more convenient to operate by virtue of, in particular, its dramatic reduction in access time to the optical disc, which has hitherto been an issue in writing operation, as compared to conventional optical disc reproducing and recording apparatuses.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (Embodiment 1)

Figure 1:
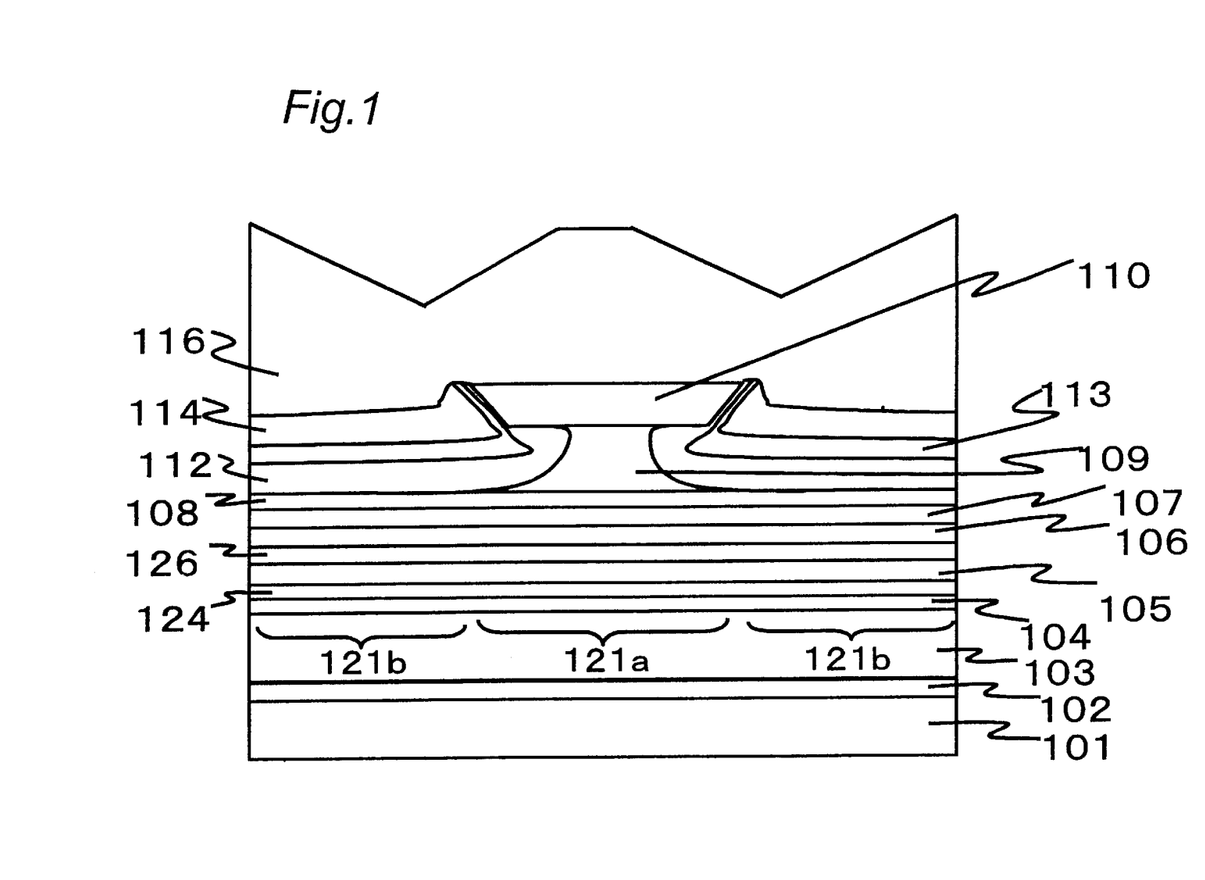
FIG. 1 is a sectional view of a semiconductor laser device according to Embodiment 1 of the present invention as it is cut by a vertical plane with respect to the stripe direction.

FIG. 1 shows a structure of a semiconductor laser device according to Embodiment 1 of the present invention. This semiconductor laser device is made up by stacking on an n-GaAs substrate 101, one after another, an n-GaAs buffer layer 102, an n-$Al_{0.5}Ga_{0.5}As$ lower cladding layer 103, an $Al_{0.35}Ga_{0.65}As$ first lower guide layer 104, an $Al_{0.25}Ga_{0.75}As$ second lower guide layer 124, a multiple-strain quantum well active layer 105, an $Al_{0.25}Ga_{0.75}As$ second upper guide layer 126, an $Al_{0.35}Ga_{0.65}As$ first upper guide layer 106, a p-$Al_{0.5}Ga_{0.5}As$ first upper cladding layer 107, and a p-GaAs etching stop layer 108. On this etching stop layer 108, are provided a mesa-stripe shaped p-$Al_{0.5}Ga_{0.5}As$ second upper cladding layer 109 and a GaAs protective layer 110. Moreover, light-current constriction regions composed of an n-$Al_{0.7}Ga_{0.3}As$ first blocking layer 112, an n-GaAs second blocking layer 113 and a p-GaAs flattening layer 114 are buried on both sides of the p-$Al_{0.5}Ga_{0.5}As$ second upper cladding layer 109 and the GaAs protective layer 110, which define a mesa-stripe shape, and furthermore a p-GaAs cap layer 116 is provided overall. This semiconductor laser device has a mesa stripe portion 121a, and mesa-stripe-portion side portions 121b, 121b on both sides of the mesa stripe portion 121a.

Next, the method for fabricating the semiconductor laser device is explained with reference to FIGS. 2 to 4.

Figure 2:
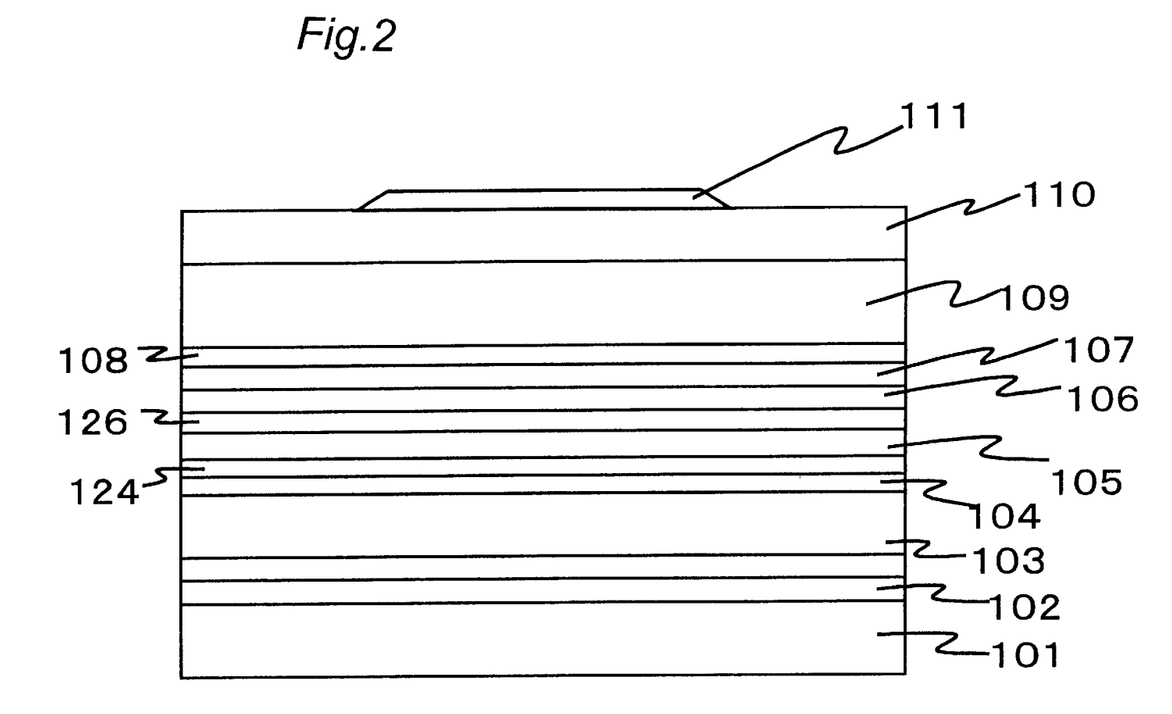
FIG. 2 is a sectional view showing a manufacturing method of the semiconductor laser device according to Embodiment 1 of the invention.

First, as shown in FIG. 2, on an n-GaAs substrate 101 having (100) surface, are crystal-grown by the MOCVD (Metal-Organic Chemical Vapor Deposition), one after another, an n-GaAs buffer layer 102 (layer thickness: 0.5 μm), an n-$Al_{0.5}Ga_{0.5}As$ lower cladding layer 103 (layer thickness: 2.0 μm), an $Al_{0.35}Ga_{0.65}As$ first lower guide layer 104 (layer thickness: 43 nm), an $Al_{0.25}Ga_{0.75}As$ second lower guide layer 124 (layer thickness: 2.0 nm), a multiple-strain quantum well active layer 105 made up by alternately disposing $In_{0.2}Ga_{0.8}As_{0.69}P_{0.31}$ compression-strain well layers (strain: 0.35%, layer thickness: 60 Å; two layers) and $GaAs_{0.72}P_{0.28}$ tensile-strain barrier layers (strain: −1.0%, three layers with layer thicknesses of 55 Å, 50 Å, 55 Å as from the substrate side), both of which are unshown, an $Al_{0.25}Ga_{0.75}As$ second upper guide layer 126 (layer thickness: 2.0 nm), an $Al_{0.35}Ga_{0.65}As$ first upper guide layer 106 (layer thickness: 43 nm), a p-$Al_{0.5}Ga_{0.5}As$ first upper cladding layer 107 (layer thickness: 0.235 μm), a p-GaAs etching stop layer 108 (layer thickness: 30 Å), a p-$Al_{0.5}Ga_{0.5}As$ second upper cladding layer 109 (layer thickness: 1.2 μm) and a GaAs protective layer 110 (layer thickness: 0.75 μm).

Figure 5:
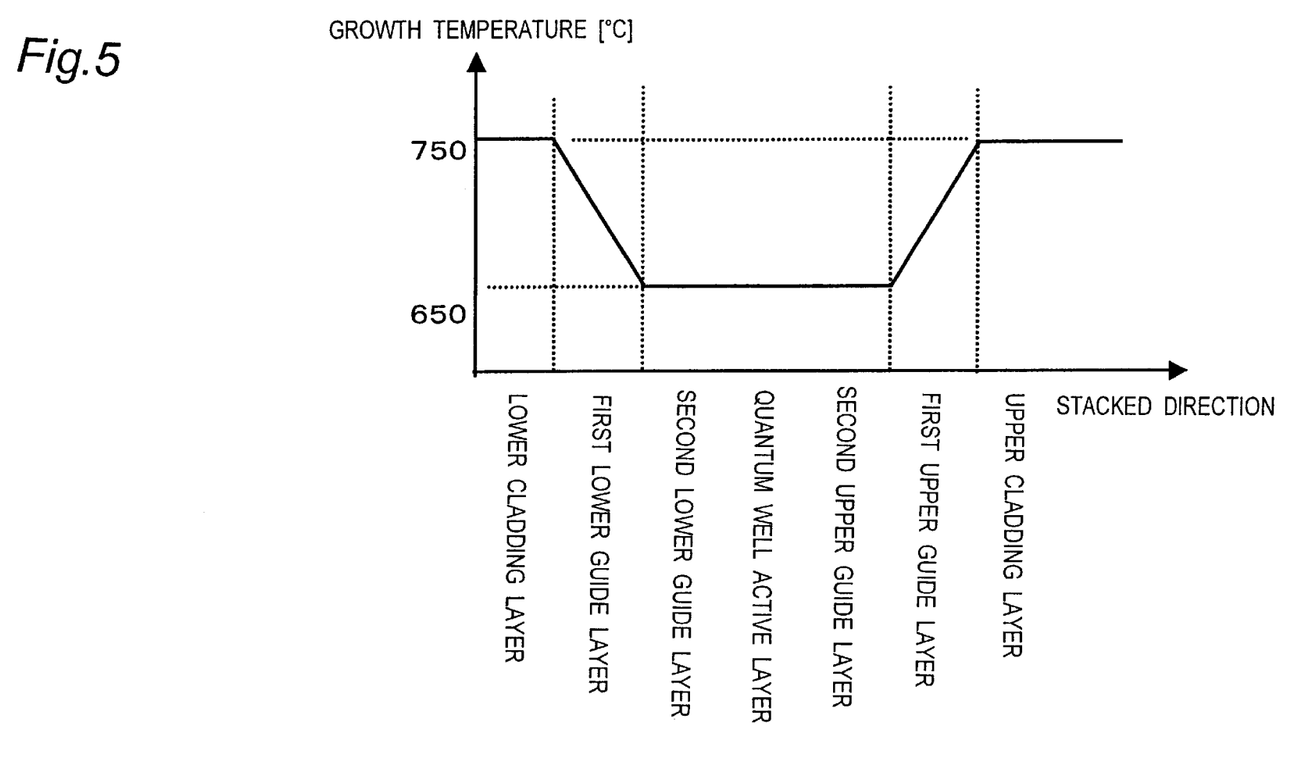
FIG. 5 is a chart of growth temperature profile of the semiconductor laser device according to Embodiment 1 of the invention.

Also, as shown in the growth temperature profile of FIG. 5, the growth temperature by MOCVD is 750° C. for the buffer layer 102 to the lower cladding layer 103. The growth temperature of the first lower guide layer 104, which is 750° C. at a start of growth, is decreased gradually along with the growth so as to be lowered to 650° C. by the time of an end. Then, at the growth temperature of 650° C., the second lower guide layer 124, the quantum well active layer 105 and the second upper guide layer 126 are stacked one after another. The growth temperature of the first upper guide layer 106, which is 650° C. at a start of the growth, is started to be increased concurrently with the growth, and gradually elevated until an end of the growth so as to be 750° C. at the end of the growth.

Next, at the growth temperature of 750° C., the first upper cladding layer 107, the etching stop layer 108, the second upper cladding layer 109 and the protective layer 110 are grown and stacked one after another.

Further, as shown in FIG. 2, a resist mask 111 is fabricated by photographic process at a portion where the above-mentioned mesa stripe portion 121a is to be formed, so that the stripe has (011) orientation.

Figure 3:
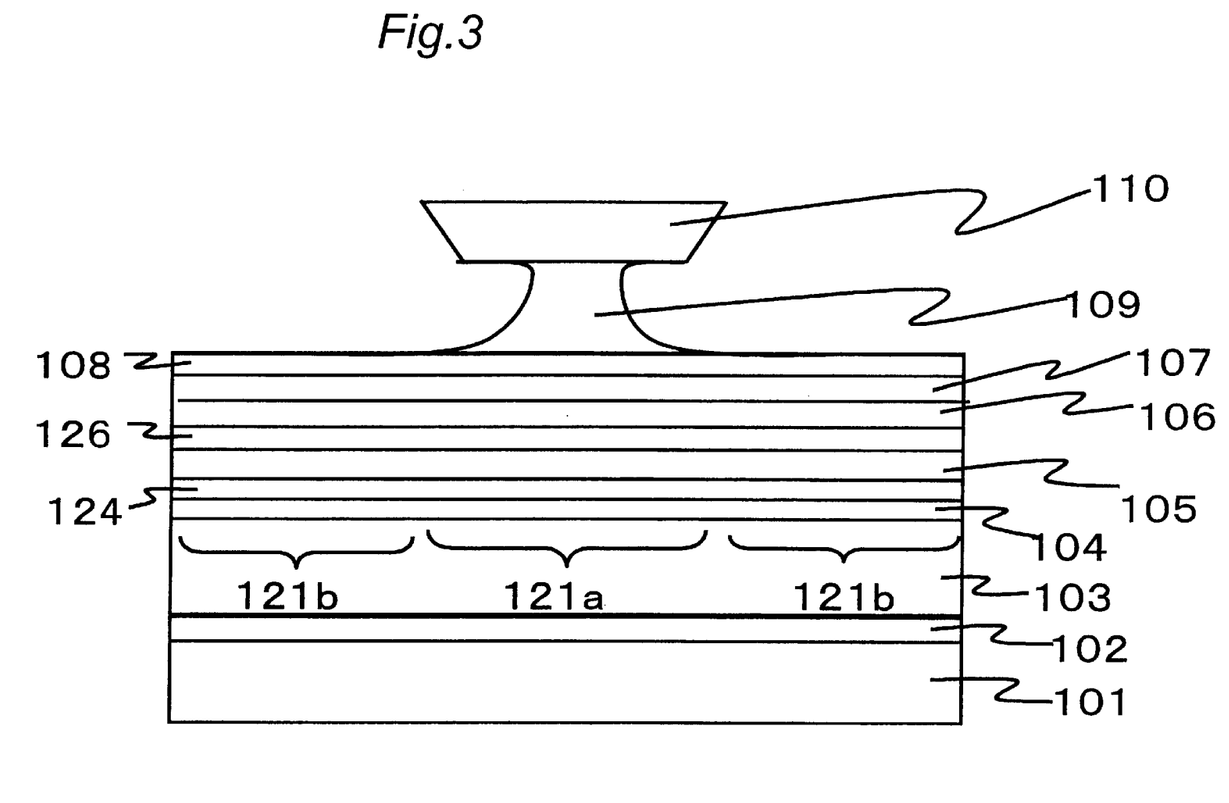
FIG. 3 is a sectional view showing the manufacturing method of the semiconductor laser device according to Embodiment 1 of the invention.

Next, as shown in FIG. 3, portions other than the resist mask portion 111 are etched, and thereafter the resist mask 111 is removed, by which the mesa stripe portion 121a is formed. This etching is carried out in two steps with a mixed aqueous solution of sulfuric acid and hydrogen peroxide solution, and with hydrofluoric acid, up to just above the etching stop layer 108. The flatness of the etching surface and the width control of the mesa is stripe are enabled by taking advantage of the fact that GaAs is very low in etching rate by hydrofluoric acid. The depth of the etching is 1.95 μm and the width of the mesa stripe portion 121a is about 2.5 μm at just above the etching stop layer 108.

Figure 4:
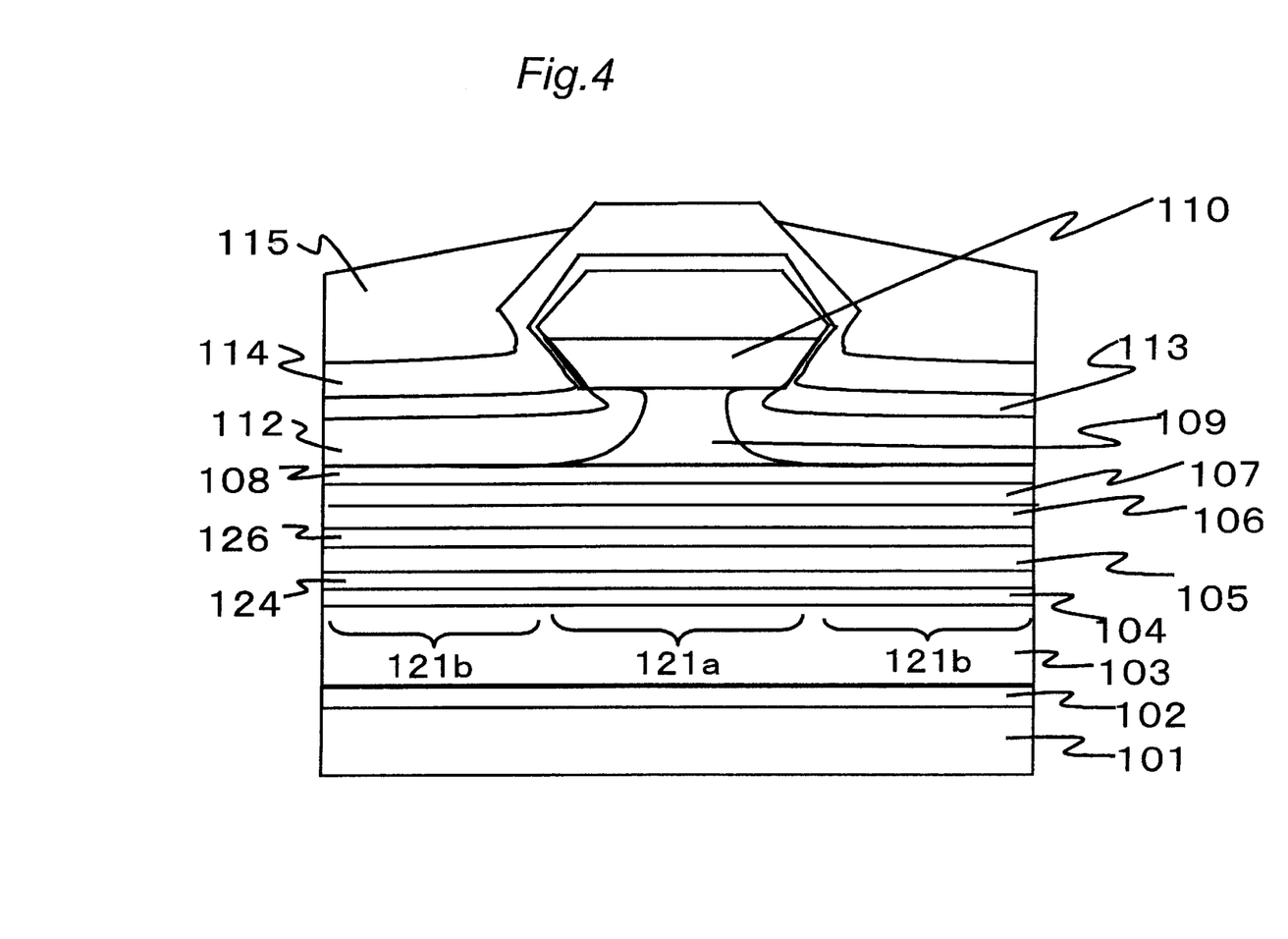
FIG. 4 is a sectional view showing the manufacturing method of the semiconductor laser device according to Embodiment 1 of the invention.

Subsequently, as shown in FIG. 4, on the etching stop layer 108 and the protective layer 110, are formed by metal-organic crystal growth, one after another, an n-$Al_{0.7}Ga_{0.3}As$ first blocking layer 112 (layer thickness: 0.6 μm), an n-GaAs second blocking layer 113 (layer thickness: 0.3 μm), and a p-GaAs flattening layer 114 (layer thickness: 1.05 μm), by which a light-current constriction region is formed. Thereafter, a resist mask 115 is formed only on the mesa-stripe-portion side portions 121b, 121b by photographic process.

Subsequently, the flattening layer 114, the second blocking layer 113 and the first blocking layer 112 on the mesa stripe portion 121a are removed by etching. This etching is carried out in two steps with a mixed solution of ammonia and hydrogen peroxide solution and with a mixed solution of sulfuric acid and hydrogen peroxide solution. Thereafter, the resist mask 115 is removed, and a p-GaAs cap layer 116 (layer thickness: 2.0 μm) is stacked. In this way, a semiconductor laser device of the structure shown in FIG. 1 can be fabricated.

Figure 6:
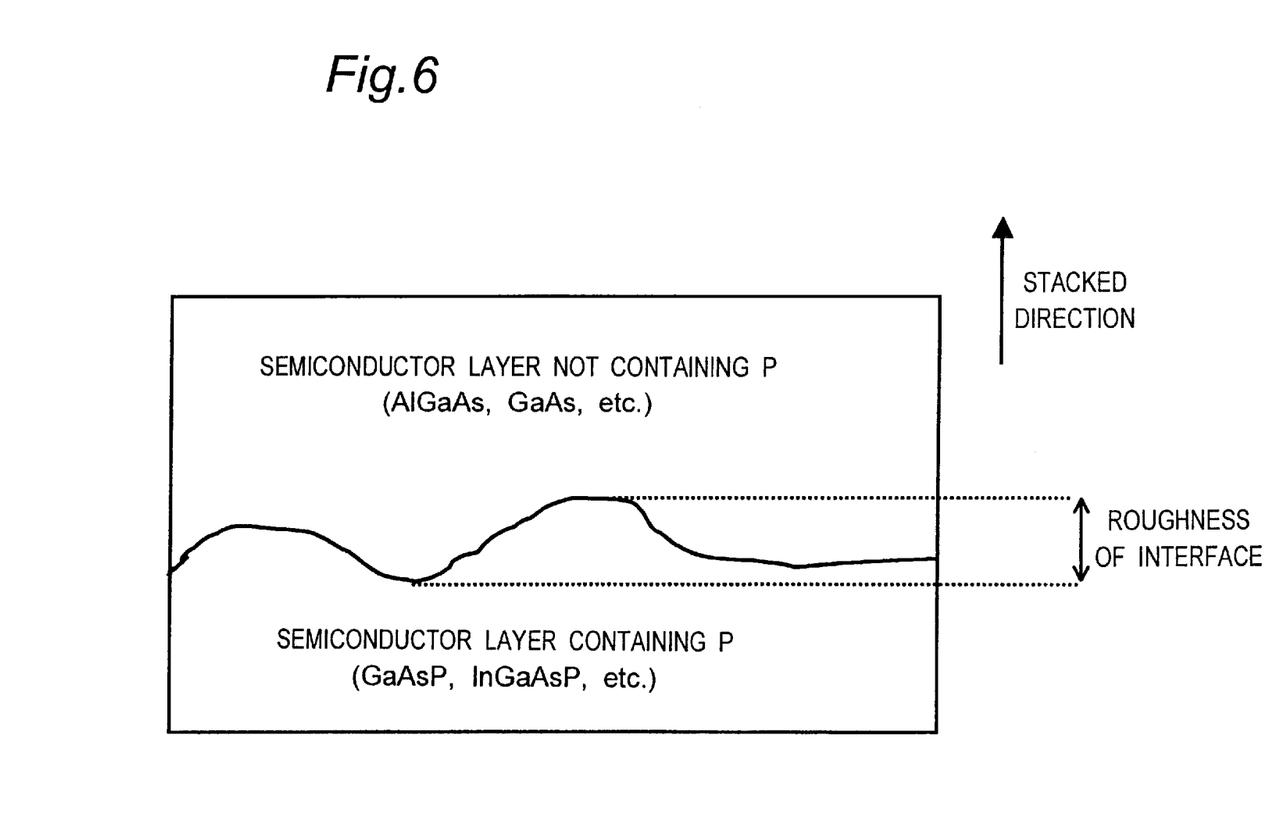
FIG. 6 is a schematic sectional view showing an interface of a semiconductor layer containing P and a semiconductor layer not containing P in the semiconductor laser device according to the present invention.

In this Embodiment 1, immediately after the stacking of the barrier layer formed of GaAsP of the multiple-strain quantum well active layer 105, the second upper guide layer 126 formed of AlGaAs is stacked. This second upper guide layer 126 is grown as it is kept at 650° C., which is suited to P-based layers. Therefore, it was shown that the level of roughness of the interface can be lowered to 20 Å by reducing the desorption of P from the barrier layer. A schematic diagram showing the roughness of the interface herein referred to is shown in FIG. 6. As a result of subjecting the semiconductor laser device of this Embodiment 1 to a reliability test, it was verified that the semiconductor laser device operates stably for over 5000 hours even at 85° C. and 200 mW. From this, it can be understood that the effects of higher power, higher reliability and longer life can be achieved.

In this Embodiment 1, the $Al_{0.25}Ga_{0.75}As$ second upper guide layer 126 is formed by growth of AlGaAs at a low temperature (650° C.). The second upper guide layer 126 is lower in Al mixed crystal ratio than the $Al_{0.35}Ga_{0.65}As$ first upper guide layer 106, which is stacked at a growth temperature higher than that of the second upper guide layer 126. Therefore, the deposition of oxygen to active Al is reduced, so that effects similar to the foregoing were obtained.

Also in this Embodiment 1, there occur no changes in growth temperature, neither involved is the interruption of growth, at the interface of the second lower guide layer 124 formed of AlGaAs and the barrier layer formed of GaAsP of the multiple-strain quantum well active layer 105. As a result, from a shortened time for which the AlGaAs second lower guide layer 124 stands exposed at the topmost surface still at low temperature, and also from the fact that the deposition of oxygen to active Al is reduced, effects similar to the foregoing were obtained. Furthermore, in order to implement the continuous growth of the AlGaAs second lower guide layer 124 and an Al-free semiconductor layer (barrier layer formed of GaAsP of the multiple-strain quantum well active layer 105) at a low temperature, the growth temperature is gradually decreased from 750° C. to 650° C. during the stacking of the first lower guide layer 104. Performing the growth of the AlGaAs second lower guide layer 124 at low temperature makes the deposition of oxygen to Al more likely to occur than at high temperature. However, the $Al_{0.25}Ga_{0.75}As$ second lower guide layer 124, which is of low-temperature growth, is lower in Al mixed crystal ratio than the $Al_{0.35}Ga_{0.65}As$ first lower guide layer 104, so that the deposition of oxygen is reduced. Even from this, effects similar to the foregoing were obtained.

Also in this Embodiment 1, since the multiple-strain quantum well active layer 105 containing a compression-strain well layer formed of InGaAsP is provided on the GaAs substrate 101, there has been implemented a high-power semiconductor laser device of high reliability and long life particularly at 780 nm band. Furthermore, by virtue of the arrangement that the compression-strain quantity of the compression-strain well layer is within 3.5%, the above effects were obtained more preferably. The strain quantity herein referred to is expressed in (a1-aGaAs)/aGaAs, where aGaAs is the lattice constant of the GaAs substrate 101 and a1 is the lattice constant of the well layer. If the value of the strain quantity is a positive one, the strain is called compression strain, and if negative, called tensile strain.

In this Embodiment 1, when the compression-strain quantity was increased by changing the composition ratio of the compression-strain well layer as the 780 nm band, there was observed a tendency that the reliability of the experimentally fabricated semiconductor laser device worsened at regions beyond the compression-strain quantity of 3.5%. Therefore, the compression-strain quantity of the compression-strain well layer is, desirably, within 3.5% in order to fabricate the semiconductor laser device with a stable film thickness.

Also in this Embodiment 1, since the compression-strain quantity is compensated for the compression-strain well layer having a compression strain by using tensile-strain barrier layers formed of InGaAsP, a multiple-strain quantum well active layer 105 having more stable crystals was able to be fabricated, so that a semiconductor laser device having high reliability was able to be realized. Further, by virtue of the arrangement that the tensile-strain quantity is within 3.5%, the above effects were able to be obtained more preferably. Furthermore, when the tensile-strain quantity was increased, there was observed a tendency that the reliability of the experimentally fabricated semiconductor laser device worsened at regions beyond the tensile-strain quantity of 3.5%. Therefore, the tensile-strain quantity of the tensile-strain barrier layer is, desirably, within 3.5% in order to fabricate the semiconductor laser device with a stable film thickness.

Also in this Embodiment 1, the second upper guide layer 126 and the second lower guide layer 124 are formed of AlGaAs, and the GaAsP tensile-strain barrier layers of the multiple-strain quantum well active layer 105 adjoins the two guide layers 126, 124. By virtue of this arrangement, there was obtained an effect of sufficiently suppressing the carrier overflow by energy (Ec) of conduction band and the energy (Ev) of valence band of AlGaAs while the reliability was ensured by preventing AlGaAs from adjoining the InGaAsP compression-strain well layer that involves occurrence of light-emission recombination. Normally, for the making of an Al-free semiconductor laser device with a view to obtaining high reliability, even the guide layers and the cladding layers are all made Al-free by using InGaP or the like. However, in this Embodiment 1, as the guide layers 124 and 126, there is provided an AlGaAs having an Al mixed crystal ratio larger than 0.2 that makes it possible to obtain with a good balance a conduction-band energy difference (ΔEc) and a valence-band energy difference (ΔEv) with respect to the compression-strain well layer formed of an InGaAsP having an emission wavelength of 780 nm band, in such an arrangement that the AlGaAs is placed at the highest possible proximity to the compression-strain well layer as far as the reliability is not affected. Moreover, an Al-free GaAsP-based thin tensile-strain barrier layer is provided between the compression-strain well layer and the guide layers 124 and 126. As a result of this, the above effects are obtained. Moreover, by an arrangement that only the compression-strain well layer and the tensile-strain barrier layers on both sides thereof are formed of Al-free layers, while such outer-side layers as the guide layers 124, 104, 126, 106 and the cladding layers 103, 107, 109 are formed of Al-containing layers, it becomes implementable to obtain sufficiently high reliability. The arrangement that the tensile-strain barrier layers adjoining the compression-strain well layer, which is a light-emitting portion, are made Al-free produced the most favorable effect on the reliability, while the arrangement that Al-containing layers are provided slightly separately outside the compression-strain well layer made it possible to obtain high reliability.

The semiconductor laser device of this Embodiment 1 has a ridge structure (a layer-stacked structure of a semiconductor laser device that its layers ranging up to the upper cladding layer forms a mesa stripe while light-current constriction layers are provided on both sides of the mesa stripe). However, even when the semiconductor laser device has a BH structure (a layer-stacked structure of a semiconductor layer that its layers ranging up to part of the lower clad forms a mesa stripe while light-current constriction layers are provided on both sides of the mesa stripe), similar effects can be obtained.

Further, although P-based layers are used as the well layer and the barrier layer in the above Embodiment 1, As-based layers formed of AlGaAs, for example, may also be used as the barrier layer. A modification example of the semiconductor laser device of Embodiment 1 is shown in FIG. 7.

Figure 7:
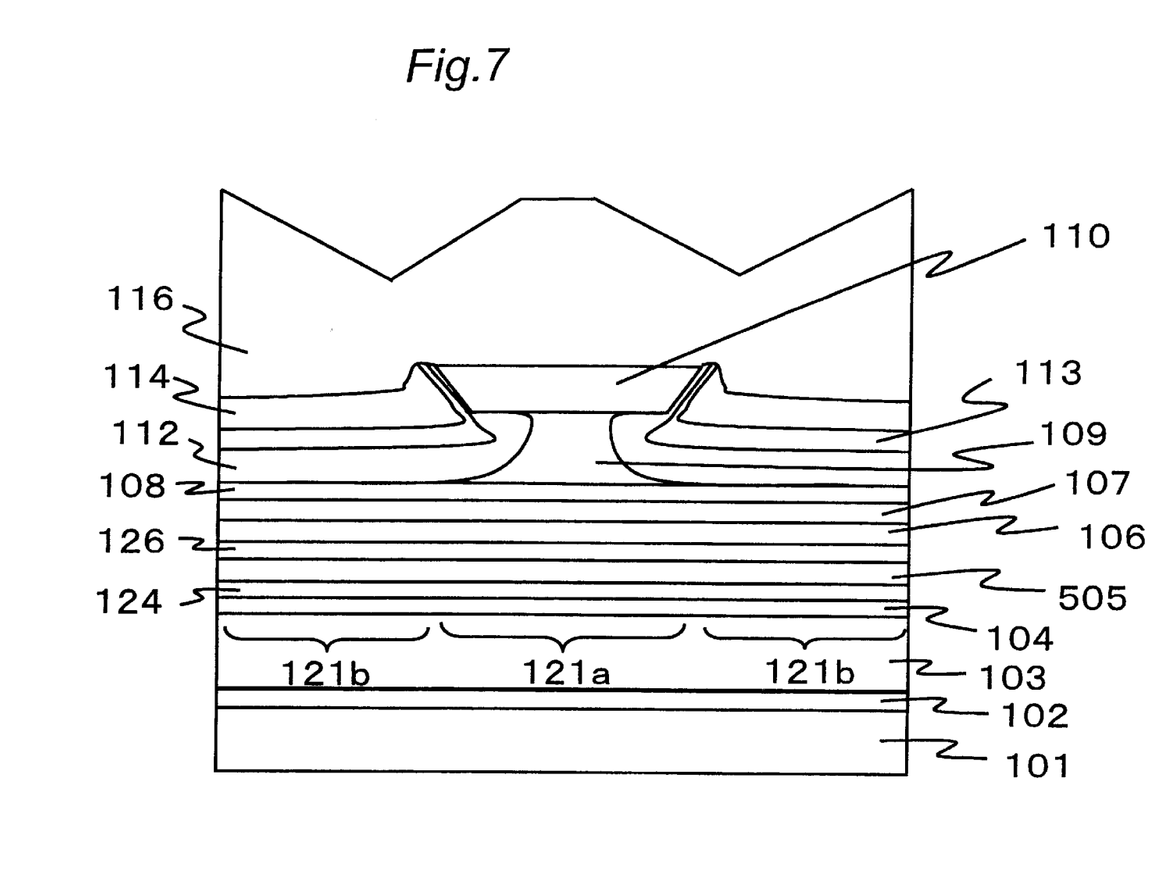
FIG. 7 is a sectional view showing a modification example of the semiconductor laser device according to Embodiment 1 of the invention.

Referring to the semiconductor laser device of FIG. 7, its constituent parts other than a multiple-strain quantum well active layer 505 are the same as those of the semiconductor laser device shown in FIG. 1. Therefore, in the reference of FIG. 7, the same constituent parts as those of the semiconductor laser device of FIG. 1 are designated by the same reference numerals and their description is omitted.

The multiple-strain quantum well active layer 505 is made up by alternately disposing unshown $In_{0.2}Ga_{0.8}As_{0.69}P_{0.31}$ compression-strain well layers (strain: 0.35%, layer thickness: 60 Å; two layers) and $Al_{0.35}Ga_{0.65}As$ barrier layers (three layers with layer thicknesses of 55 Å, 50 Å, 55 Å as from the substrate side), both of which are unshown.

Working effects of the semiconductor laser device of this modification example are similar to those of the semiconductor laser device of Embodiment 1.

(Embodiment 2)

Figure 8:
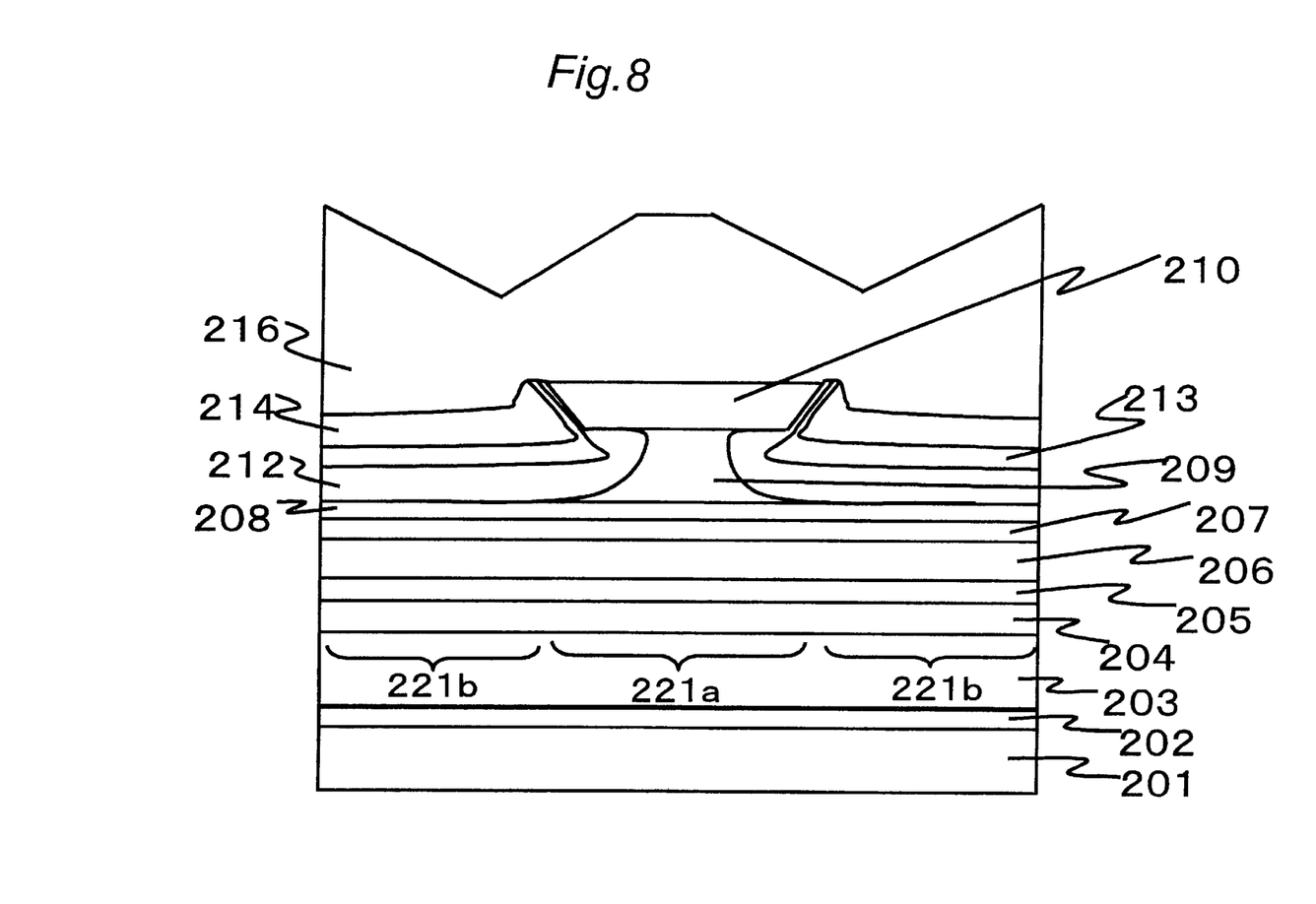
FIG. 8 is a sectional view of a semiconductor laser device according to Embodiment 2 of the present invention as it is cut by a vertical plane with respect to the stripe direction.

FIG. 8 is a sectional view of a semiconductor laser device according to Embodiment 2 of the present invention. This semiconductor laser device is made up by stacking on an n-GaAs substrate 201, one after another, an n-GaAs buffer layer 202, an n-$Al_{0.5}Ga_{0.5}As$ lower cladding layer 203, an $Al_{0.4}Ga_{0.6}As$ lower guide layer 204, a multiple-strain quantum well active layer 205, an $Al_{0.4}Ga_{0.6}As$ upper guide layer 206, a p-$Al_{0.5}Ga_{0.5}As$ first upper cladding layer 207, and a p-GaAs etching stop layer 208. On this etching stop layer 208, are provided a p-$Al_{0.478}Ga_{0.522}As$ second upper cladding layer 209 and a GaAs protective layer 210, which are mesa-stripe shaped. Moreover, light-current constriction regions composed of an n-$Al_{0.7}Ga_{0.3}As$ first blocking layer 212, an n-GaAs second blocking layer 213 and a p-GaAs flattening layer 214 are buried on both sides of the p-$Al_{0.478}Ga_{0.522}As$ second upper cladding layer 209 and the GaAs protective layer 210, which are mesa-stripe shaped, and furthermore a p-GaAs cap layer 216 is provided overall. This semiconductor laser device has a mesa stripe portion 221a, and mesa-stripe-portion side portions 221b, 221b on both sides of the mesa stripe portion 221a.

Next, the method for fabricating the semiconductor laser device is explained with reference to FIGS. 8 to 9.

First, as shown in FIG. 8, on an n-GaAs substrate 201 having (100) surface, are crystal-grown by the MOCVD, one after another, an n-GaAs buffer layer 202 (layer thickness: 0.5 μm), an n-$Al_{0.5}Ga_{0.5}As$ lower cladding layer 203 (layer thickness: 2.5 μm), an $Al_{0.4}Ga_{0.6}As$ lower guide layer 204 (layer thickness: 0.1 μm), a multiple-strain quantum well active layer 205 made up by alternately disposing $In_{0.2686}Ga_{0.7314}As_{0.5544}P_{4456}$ compression-strain well layers (strain: 0.395%, layer thickness: 80 Å; two layers) and $In_{0.176}Ga_{0.824}As_{0.684}P_{0.316}$ tensile-strain barrier layers (three layers with layer thicknesses of 215 Å, 79 Å, 215 Å as from the substrate side), both of which are unshown, an $Al_{0.4}Ga_{0.6}As$ upper guide layer 206 (layer thickness: 0.1 μm), a p-$Al_{0.5}Ga_{0.5}As$ first upper cladding layer 207 (layer thickness: 0.235 μm), a p-GaAs etching stop layer 208 (layer thickness: 30 Å), a p-$Al_{0.478}Ga_{0.522}As$ second upper cladding layer 209 (layer thickness: 1.28 μm) and a GaAs protective layer 210 (layer thickness: 0.75 μm).

Figure 9:
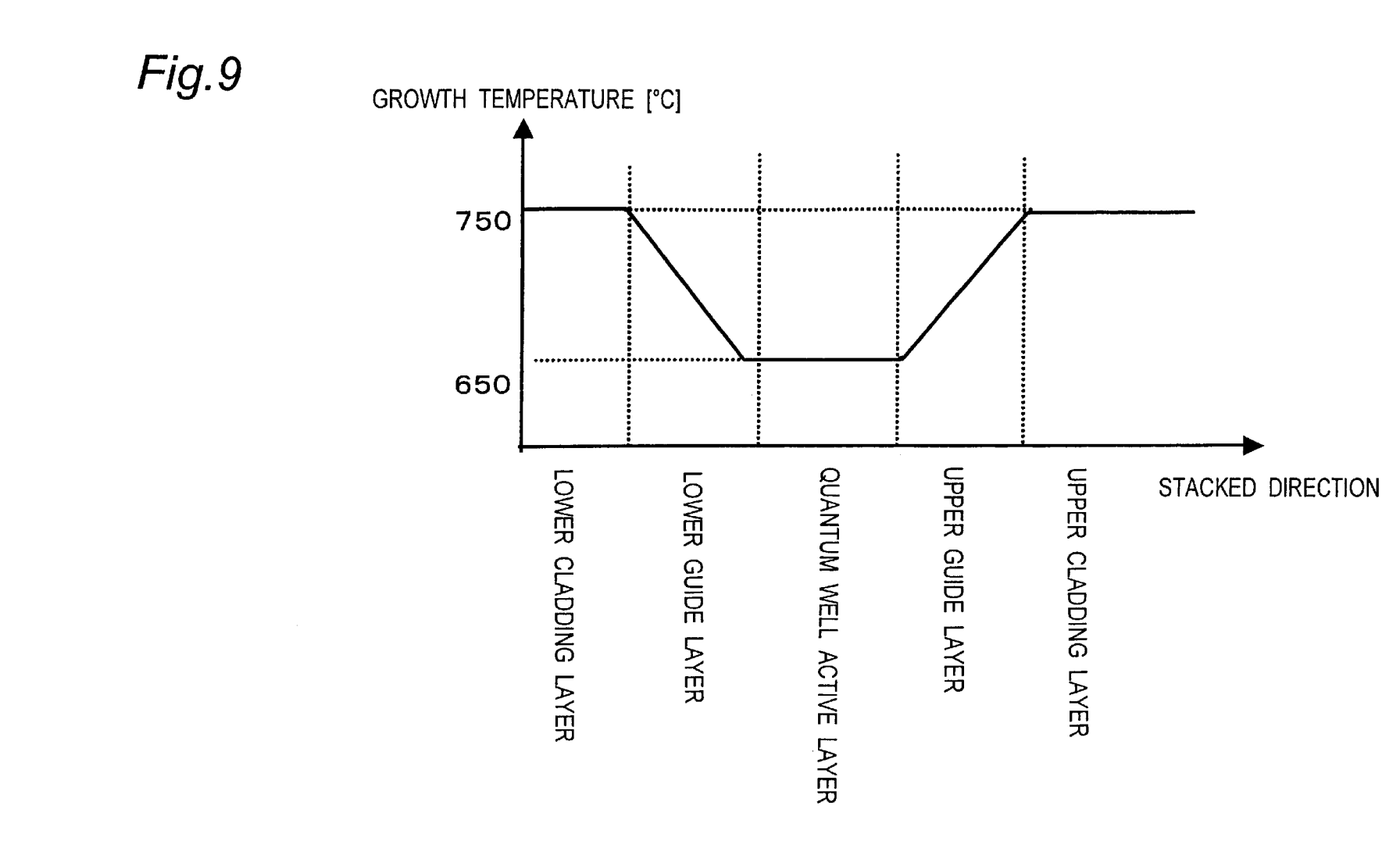
FIG. 9 is a chart of growth temperature profile of the semiconductor laser device according to Embodiment 2 of the invention.

Also, as shown in the growth temperature profile of FIG. 9, the growth temperature by MOCVD is 750° C. for the buffer layer 202 to the lower cladding layer 203. The growth temperature of the lower guide layer 204, which is 750° C. at a start of growth, is decreased gradually along with the growth so as to be lowered to 650° C. by the time of an end of the growth. Then, at the growth temperature of 650° C., the quantum well active layer 205 composed of the compression-strain well layers and the tensile-strain barrier layers is stacked. The growth temperature of the upper guide layer 206, which is 650° C. at a start of the growth, is started to be increased concurrently with the growth, and gradually elevated until an end of the growth so as to be 750° C. at the end of the growth.

Next, at the growth temperature of 750° C., the first upper cladding layer 207, the etching stop layer 208, the second upper cladding layer 209 and the protective layer 210 are grown and stacked one after another.

Further, although not shown, a resist mask is fabricated by photographic process at a portion where the above-mentioned mesa stripe portion 221a is to be formed, so that the stripe has [011] orientation. Subsequently, portions other than the resist mask portion are etched, and thereafter the resist mask is removed, by which the mesa stripe portion 221a is formed. This etching is carried out in two steps with a mixed aqueous solution of sulfuric acid and hydrogen peroxide solution, and with hydrofluoric acid, up to just above the etching stop layer 208. The flatness of the etching surface and the width control of the mesa stripe are enabled by taking advantage of the fact that GaAs is very low in etching rate by hydrofluoric acid. The depth of the etching is 2.03 μm and the width of the mesa stripe portion 221a is about 2.5 μm at just above the etching stop layer 208.

Subsequently, on the etching stop layer 208 and the protective layer 210, are formed by metal-organic crystal growth, one after another, an n-$Al_{0.7}Ga_{0.3}As$ first blocking layer 212 (layer thickness: 0.6 μm), an n-GaAs second blocking layer 213 (layer thickness: 0.3 μm), and a p-GaAs flattening layer 214 (layer thickness: 1.13 μm), by which a light-current constriction region is formed. Thereafter, although not shown, a resist mask is formed only on the mesa-stripe-portion side portions 221b, 221b by photographic process.

Subsequently, the flattening layer 214, the second blocking layer 213 and the first blocking layer 212 on the mesa stripe portion 221a are removed by etching. This etching is carried out in two steps with a mixed aqueous solution of ammonia and hydrogen peroxide solution and with a mixed aqueous solution of sulfuric acid and hydrogen peroxide solution. Thereafter, the resist mask is removed, and a p-GaAs cap layer 216 (layer thickness: 2.0 μm) is stacked. In this way, a semiconductor laser device of the structure shown in FIG. 8 can be fabricated.

In this Embodiment 2, immediately after the stacking of the barrier layer formed of InGaAsP of the multiple-strain quantum well active layer 205, the upper guide layer 206 formed of AlGaAs is stacked. This upper guide layer 206 is started to be grown at 650° C., which is a growth temperature suited to P-based layers. Therefore, it was shown that the level of roughness of the interface can be lowered to 20 Å by reducing the desorption of P from the barrier layer. As a result of subjecting the semiconductor laser device of this Embodiment 2 to a reliability test, it was verified that the semiconductor laser device operates stably for over 5000 hours even at 85° C. and 200 mW. From this, it can be understood that the effects of higher power, higher reliability and longer life were able to be achieved.

In this Embodiment 2, the upper guide layer 206, although started growth of AlGaAs at a low temperature, yet is grown under gradual temperature increase so as to be stacked at a growth temperature more suitable for AlGaAs. Thus, also from the fact that the deposition of oxygen to active Al is reduced, effects similar to the foregoing were obtained.

Also in this Embodiment 2, there is involved no interruption of growth at the interface of the lower guide layer 204 formed of AlGaAs and the tensile-strain barrier layer formed of InGaAsP of the multiple-strain quantum well active layer 205. As a result, from the fact that the deposition of oxygen to active Al is reduced because of a shortened time for which the AlGaAs layer stands exposed at the topmost surface still at low temperature, effects similar to the foregoing were obtained.

Also in this Embodiment 2, since the multiple-strain quantum well active layer 205 containing a compression-strain well layer formed of InGaAsP is provided on the GaAs substrate 201, there has been implemented a high-power semiconductor laser device of high reliability and long life particularly at 780 nm band. Furthermore, by virtue of the arrangement that the compression-strain quantity is within 3.5%, the above effects were obtained more preferably.

In this Embodiment 2, when the compression-strain quantity was increased by changing the composition ratio of the compression-strain well layer as the 780 nm band, there was observed a tendency that the reliability of the experimentally fabricated semiconductor laser device worsened at regions beyond the compression-strain quantity of 3.5%. Therefore, the compression-strain quantity of the compression-strain well layer is, desirably, within 3.5% in order to fabricate the semiconductor laser device with a stable film thickness.

Also in this Embodiment 2, since the compression-strain quantity is compensated for the compression-strain well layer having a compression strain by using a tensile-strain barrier layer formed of InGaAsP, a multiple-strain quantum well active layer 205 having more stable crystals was able to be fabricated, so that a semiconductor laser device having high reliability was able to be realized. Further, by virtue of the arrangement that the tensile-strain quantity is within 3.5%, the above effects were able to be obtained more preferably. Furthermore, when the tensile-strain quantity was increased, there was observed a tendency that the reliability of the experimentally fabricated semiconductor laser device worsened at regions beyond the tensile-strain quantity of 3.5%. Therefore, the tensile-strain quantity of the tensile-strain barrier layer is, desirably, within 3.5% in order to fabricate the semiconductor laser device with a stable film thickness.

Also in this Embodiment 2, the upper guide layer 206 and the lower guide layer 204 are formed of AlGaAs, and the InGaAsP tensile-strain barrier layers of the multiple-strain quantum well active layer 205 adjoin the two guide layers 206, 204. By virtue of this arrangement, there was obtained an effect of sufficiently suppressing the carrier overflow by energy (Ec) of conduction band and the energy (Ev) of valence band of AlGaAs while the reliability was ensured by preventing AlGaAs from adjoining the InGaAsP compression-strain well layer that involves occurrence of light-emission recombination. Normally, for the making of an Al-free semiconductor laser device with a view to obtaining high reliability, even the guide layers and the cladding layers are all made Al-free by using InGaP or the like. However, in this Embodiment 2, as the guide layers 204 and 206, there is provided an AlGaAs having an Al mixed crystal ratio larger than 0.2 that makes it possible to obtain with a good balance a conduction-band energy difference ($\Delta Ec$) and a valence-band energy difference ($\Delta Ev$) with respect to the compression-strain well layer formed of an InGaAsP having an emission wavelength of 780 nm band, in such an arrangement that the AlGaAs is placed at the highest possible proximity to the compression-strain well layer as far as the reliability is not affected. Moreover, an Al-free InGaAsP-based thin barrier layer as described above is provided between the compression-strain well layer and the guide layers 204 and 206. As a result of this, the above effects are obtained. Moreover, by an arrangement that only the compression-strain well layer and the barrier layers on both sides thereof are formed of Al-free layers, while such outer-side layers as the guide layers 204, 206 and the cladding layers 203, 207, 109 are formed of Al-containing layers, it becomes implementable to obtain sufficiently high reliability. The arrangement that the regions adjoining the compression-strain well layer, which is a light-emitting portion, are formed of Al-free layers produced the most favorable effect on the reliability, while the arrangement that Al-containing layers are provided slightly separately outside the compression-strain well layer made it possible to obtain high reliability.

In this Embodiment 2, the semiconductor laser device has a ridge structure. Even when the semiconductor laser device has a BH structure, similar effects can be obtained.

In the above-described Embodiments 1 and 2, the semiconductor layers are formed by MOCVD. However, the semiconductor layers may also be formed by other methods such as molecular beam epitaxy of gas sources or organic metal sources.

Also, although the well layers are provided two in number in the Embodiments 1 and 2, the number of well layers may be any arbitrary one. Besides, the layer thickness of the well layers is not limited to that shown in Embodiments 1 and 2.

Also, although the semiconductor laser device is of a ridge structure in the Embodiments 1 and 2, yet the present invention may be applied also to semiconductor laser devices of not only BH structure but also broad area structure.

Also, although a semiconductor-buried structure of pn inverse-conjunction formed of the current blocking layers 112, 113, 212, 213 is used in the Embodiments 1 and 2, yet it is also possible to use a high-resistance-layer buried structure or a dielectric-film buried structure or the like.

(Embodiment 3)

Figure 10:
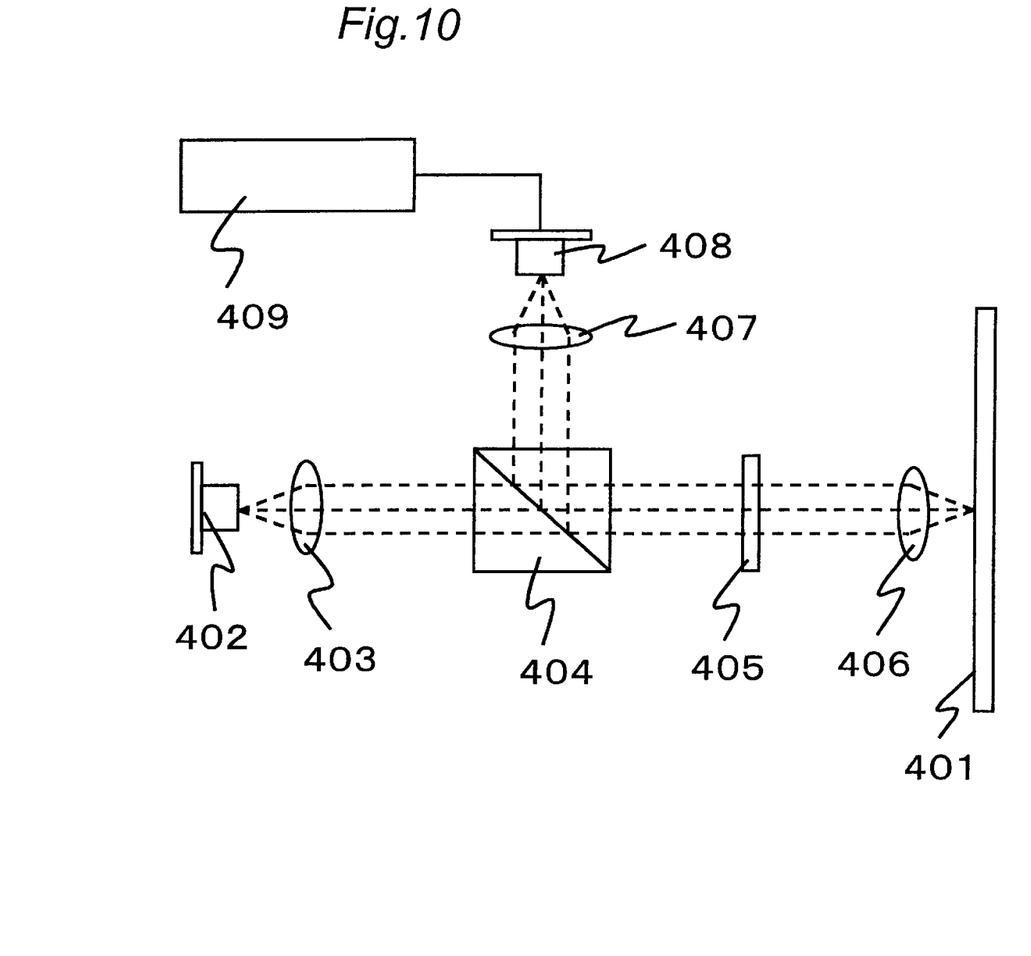
FIG. 10 is a schematic view of an optical disc reproducing and recording apparatus according to Embodiment 3 of the invention.

FIG. 10 shows a structure of an optical disc recording and reproducing apparatus according to Embodiment 3 of the present invention. This optical disc recording and reproducing apparatus, serving for writing data to an optical disc 401 or reproducing written data therefrom, includes a semiconductor laser device 402 identical to the semiconductor laser device of Embodiment 1 as described above as a light-emitting device.

This optical disc recording and reproducing apparatus is explained in more detail. For writing, a laser beam carrying a data signal and emitted from the semiconductor laser device 402 is made into parallel light by a collimator lens 403, and transmitted by a beam splitter 404. This laser beam transmitted by the beam splitter 404 is adjusted in polarization by a λ/4 polarizer 405, and then converged by an objective lens 406 so as to be applied to the optical disc 401. Thus, data is recorded on this optical disc 401.

For reading, on the other hand, a laser beam carrying no data signal is applied to the optical disc 401 along the same route as in writing. This laser beam is reflected by the surface of the optical disc 401 on which data has been recorded, thus making reproduced light carrying a data signal. This reproduced light, after passing through the objective lens 406 for laser beam irradiation and the λ/4 polarizer 405, is reflected by the beam splitter 404 so as to be changed in angle by 90°, and thereafter converged by an objective lens 407 for reproduced light, thus coming incident on a signal-detection photodetector device 408. In this signal-detection photodetector device 408, the data signal carried on the laser beam is transformed into an electric signal according to the intensity of the incident laser beam. Thus, original data is reproduced in a signal-light reproducing circuit 409.

The optical disc recording and reproducing apparatus of Embodiment 3 as described above, by virtue of employing the semiconductor laser device 402 that operates with higher optical output than conventional, is enabled to read and write data even if the disc rotating speed is enhanced over the conventional. Thus, it has become implementable to provide an optical disc recording and reproducing apparatus which is more convenient to operate by virtue of, in particular, its dramatic reduction in access time to the optical disc, which has hitherto been an issue in writing operation, as compared to optical disc recording and reproducing apparatuses employing the conventional semiconductor laser device.

The description given hereinabove has been made on an example in which the semiconductor laser device of the present invention is applied to an optical disc recording and reproducing apparatus. However, it is needless to say that the semiconductor laser device of the invention is applicable also to optical disc recording apparatuses and optical disc reproducing apparatuses using the 780 nm wavelength band.

As apparent from the above description, the semiconductor laser device of the present invention has a 20 Å or less roughness of the interface between the P-based layer, which is formed of group III–V compound semiconductor containing P as a group V element, and the As-based layer, which is formed of group III–V compound semiconductor containing not P but As as a group V element. Therefore, the semiconductor laser device is improved in crystallinity of the interface, thus having an advantage of high reliability, long life and high power.

Further, the manufacturing method of the semiconductor laser device of the present invention includes the steps of starting growth of the above As-based layer on the above P-based layer at a growth temperature approximately equal to a first growth temperature, which is a growth temperature of the P-based layer, and thereafter, furthering the growth while elevating the temperature up to a second temperature. Therefore, the roughness level of the interface between the P-based layer and the As-based layer can be lowered to 20 Å or less by reducing the desorption of P from the P-based layer, so that the crystallinity of the interface can be improved. Thus, it becomes implementable to fabricate a high-reliability, long-life, high-power semiconductor laser device.

Furthermore, the optical disc reproducing and recording apparatus of the present invention employs the above-described high-reliability, long-life, high-power semiconductor laser device. Therefore, the optical disc reproducing and recording apparatus is capable of reading and writing data even if heightened in the optical-disc rotating speed over the conventional, so that the access time to the optical disc is dramatically shortened, as compared to conventional optical disc reproducing and recording apparatuses. Thus, the optical disc reproducing and recording apparatus of the invention is more convenient to operate.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device including, on a GaAs substrate, at least a first-conductive-type lower cladding layer, a lower guide layer, a quantum well active layer composed of at least one well layer and at least two barrier layers, an upper guide layer and a second-conductive-type upper cladding layer, one on another, wherein at least one layer out of the plurality of layers is a P-based layer formed of group III–V compound semiconductor containing P as a group V element, and a layer adjoining this P-based layer is an As-based layer formed of group III–V compound semiconductor containing not P but As as a group V element, and roughness of an interface between the P-based layer and the As-based layer is not more than 20 Å.

2. The semiconductor laser device according to claim 1, wherein the interface between the P-based layer and the As-based layer is disposed between the upper cladding layer and the lower cladding layer.

3. The semiconductor laser device according to claim 1, wherein the P-based layer is formed of InGaAsP, InGaP, GaAsP or AlGaInP.

4. The semiconductor laser device according to claim 1, wherein the As-based layer is formed of GaAs, AlGaAs, AlAs, InGaAs or AlGaInAs.

5. The semiconductor laser device according to claim 1, wherein the well layer is the P-based layer.

6. The semiconductor laser device according to claim 1, wherein the barrier layer is the P-based layer.

7. The semiconductor laser device according to claim 1, wherein both the well layer and the barrier layers are P-based layers and both the upper guide layer and the lower guide layer are As-based layers.

8. The semiconductor laser device according to claim 7, wherein both the well layer and the barrier layers are formed of InGaAsP and both the upper guide layer and the lower guide layer in adjacency to the barrier layers are formed of AlGaAs.

9. The semiconductor laser device according to claim 8, wherein Al composition ratio in the group III of the upper guide layer and the lower guide layer is not less than 0.20.

10. The semiconductor laser device according to claim 1, wherein emission wavelength is not less than 760 nm and not more than 800 nm.

11. An optical disc reproducing and recording apparatus which uses the semiconductor laser device as defined in claim 1.

* * * * *